(12) United States Patent
Nakagawa et al.

(10) Patent No.: US 6,429,035 B2
(45) Date of Patent: *Aug. 6, 2002

(54) METHOD OF GROWING SILICON CRYSTAL IN LIQUID PHASE AND METHOD OF PRODUCING SOLAR CELL

(75) Inventors: Katsumi Nakagawa, Atsugi; Shoji Nishida, Hiratsuka; Noritaka Ukiyo; Masaaki Iwane, both of Atsugi, all of (JP)

(73) Assignee: Canon Kabushiki Kaisha, Tokyo (JP)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/198,263

(22) Filed: Nov. 24, 1998

(30) Foreign Application Priority Data

Nov. 28, 1997 (JP) ............................................. 9-328186

(51) Int. Cl.$^7$ ............................................. H01L 21/20
(52) U.S. Cl. ................ 438/57; 438/501; 438/478; 438/97
(58) Field of Search ..................... 438/57, 500, 501, 438/478, 96, 97, 497; 117/2, 19, 37, 41, 78, 931, 934

(56) References Cited

U.S. PATENT DOCUMENTS

| | | | | |
|---|---|---|---|---|
| 4,236,947 A | * | 12/1980 | Baliga | 148/171 |
| 4,717,688 A | * | 1/1988 | Jaentsch | 438/99 |
| 4,818,337 A | * | 4/1989 | Barnett et al. | 438/99 |
| 5,854,123 A | * | 12/1998 | Sato et al. | 438/507 |
| 5,902,416 A | * | 5/1999 | Kern et al. | 436/244 |

FOREIGN PATENT DOCUMENTS

| | | |
|---|---|---|
| JP | 9-183695 | 7/1997 |
| JP | 9-183696 | 7/1997 |

OTHER PUBLICATIONS

G.F. Zheng et al., "16.4% efficient, thin active layer silicon solar cell grown by liquid phase epitaxy", Solar Ener. Mat. and Solar Cells, vol. 40, pp. 231–238 (1996).

* cited by examiner

Primary Examiner—Savitri Mulpuri
(74) Attorney, Agent, or Firm—Fitzpatrick, Cella Harper & Scinto (57) ABSTRACT

A method of growing single crystal silicon in a liquid phase comprises preparing a melt by dissolving a solid of silicon containing boron, aluminum, phosphorus or arsenic at a predetermined concentration into indium melted in a carbon boat or a quartz crucible, supersaturating the melt, and submerging a substrate into the melt, thereby growing a silicon crystal containing a dopant element. This method can provide a method of growing a thin film of crystalline silicon having a high crystallinity and a dopant concentration favorably controlled, thereby serving for mass production of inexpensive solar cells which have high performance as well as image displays which have high contrast and are free from color ununiformity.

8 Claims, 4 Drawing Sheets

METHOD OF GROWING SILICON CRYSTAL IN LIQUID PHASE AND METHOD OF PRODUCING SOLAR CELL

BACKGROUND OF THE INVENTION

1. Field of the Invention

The present invention relates to a method of growing a silicon crystal in a liquid phase. A silicon crystal produced by the method of the present invention can be used in silicon devices having a large area such as solar cells and picture element driving circuits for liquid crystal display devices.

2. Related Background Art

Solar cells are prevailing as electric power sources which are systematically linked with driving power sources for various kinds of appliances and commercial line power. It is desirable to manufacture solar cells at low cost. For example, it is desired to produce solar cells on inexpensive substrates at a low cost. Silicon is generally used as a semiconductor for composing solar cells. Single crystalline silicon is extremely excellent from a viewpoint of efficiency of converting light energy into electric power, that is, photoelectric conversion efficiency. From the viewpoints of enlargement of area and reduction of manufacturing cost, on the other hand, amorphous silicon is advantageous. In recent years, polycrystalline silicon has been used for the purpose of obtaining a cost as low as that of amorphous silicon and a photoelectric conversion efficiency as high as that of single crystalline silicon.

However, it cannot be said that the expensive crystalline materials are sufficiently utilized by a method which is conventionally adopted to manufacture silicon devices using single crystalline silicon or polycrystalline silicon since the method is configured to slice a lump crystal to form plate-like substrates and is hardly capable of preparing substrates which have thicknesses of 0.3 mm or smaller, thereby allowing the substrates to have thicknesses larger than a thickness (20 $\mu$m to 50 $\mu$m) generally required to absorb incident rays. Furthermore, there has recently been proposed the spin method of forming a silicon sheet by flowing drops of melted silicon into a template. However, a silicon sheet formed by this method has a quality insufficient for use as a semiconductor and cannot provide a photoelectric conversion efficiency which is so high as that in the case of using a general crystalline silicon.

There has been proposed and actually applied to trial production of a solar cell under the circumstances described above, an idea of growing on an inexpensive substrate a silicon crystal of a good quality until it has a required and sufficient thickness and forming an active region (for example, a photoelectric conversion region) thereon. Moreover, there has been proposed an idea of growing a silicon crystal epitaxially on a substrate of a good quality and then peeling off the silicon crystal and reusing the substrate.

On a premise that large area devices such as solar cells are to be produced in mass, however, it is not so easy to grow a silicon crystal until it has a thickness required for absorbing incident rays. A silicon crystal of a good quality is generally grown by the thermal CVD method of thermally decomposing a raw material gas such as silane chloride. In order to grow a single crystal at a high rate on the order of 1 $\mu$m/minute in particular, it is typical to use the so-called epitaxial growing furnace. However, such a growing furnace is not only unsuited to mass production since it can treat 10 wafers at most at one batch, but also requires a high raw material cost since it utilizes a raw material gas at a low efficiency. Though it is possible to treat 100 or more wafers at one batch by utilizing the so-called low pressure CVD furnace, this furnace also provides a crystal insufficient in quality and allows the crystal to grow at a rate only on the order of 0.01 $\mu$m/minute, thereby being low in productivity.

As another method of growing a silicon crystal, there is known a liquid phase growing method of supersaturating a liquid metal solution in which silicon is dissolved and allowing a crystal to deposit from the solution onto a substrate. This liquid phase growing method is capable of growing a crystal of a high quality at a high rate on the order of 1 $\mu$m/minute and treating 100 or more wafers at one batch, thereby being suited to mass production. However, the liquid phase growing method is not generally used for growing silicon and has some technical problems to be solved though it widely prevails as a method of growing compound semiconductors.

One important problem lies in selection of a metal which is to be used as a solvent. It is desirable that a metal to be used for this purpose has a solubility for silicon which is as high as possible and can hardly be incorporated into deposited silicon. Furthermore, a metal having a lower melting point and a lower vapor pressure can be handled easier. Tin is used most generally as a solvent for silicon. Tin can be handled relatively easily since it has a low melting point and a relatively high solubility for silicon. It has been considered that tin is a preferable solvent since tin and silicon belong to Group IV of the periodic table, and tin is inactive as a dopant even when it is incorporated into deposited silicon.

However, the inventors have recently found that tin is incorporated into silicon in a relatively large amount when growth conditions (in particular, a growth temperature) are inadequate, thereby deforming a lattice of a silicon crystal and adversely affecting electric characteristics of a semiconductor probably due to the atomic size of tin which is very different from that of silicon though they are atoms belonging to Group IV. From this viewpoint, there is posed a doubt in the aptitude of tin as a solvent which is used to grow a crystal for a solar cell with high efficiency.

In addition to tin, elements such as gallium, indium and aluminum which belong to Group III can be mentioned as metals which are usable as solvents. Gallium and indium, in particular, having a low melting point can be handled easily. Since gallium is extremely expensive, indium is hopeful for use as a practical melt. However, indium posed a problem which is described later in control by introducing dopant a conductivity type of a silicon crystal which is grown using an indium melt. There are known examples wherein gallium is used as p-type dopant in combination with an indium melt (G. F. Zheng et al.: Solar Energy Materials and Solar Cells. 40 (1996) 231–238). Though gallium is usable at relatively low concentrations, it cannot be used for doping at high concentrations since a solid of gallium can be dissolved into silicon at concentrations within a relatively low solubility and is extremely expensive. On the other hand, examples which use n-type dopants in combination with indium melts are disclosed by Japanese Patent Application Laid-Open Nos. 9-183695 and 9-183696.

Boron and aluminum are generally used as p-type dopants, whereas phosphorus and arsenic are often used as n-type dopants. It is therefore conceivable to use these dopants for growing silicon crystals in liquid phase with the indium melt. In practice, however, problems were posed in conductivity types or reproducibility of conductivities of grown silicon crystals in certain cases. Furthermore, it is feared that a metal of Group III such as indium which is originally active by itself as a dopant may control a crystal to a strong p-type when incorporated into silicon and may be incapable of controlling it to p⁻-type or n-type.

The problems described above make it still impossible to judge whether or not the liquid phase method has a true aptitude for growth of silicon crystals on scales of mass production and whether or not solar cells utilizing thin films of silicon crystals have practical utility.

Thin films of silicon crystals are also used as devices for driving picture elements of liquid crystal displays and so on. Progress made in mass communication media have produced increasing demands for a display having a larger screen and capable of more minutely driving at a higher speed. Though the TFTs (thin film transistors) of amorphous silicon have hitherto been utilized as a driving circuit for picture elements to cope with the demands for a display having a larger screen, amorphous silicon can no longer meet the demands for a display which can be more minutely driven at a higher speed, and TFTs of polycrystalline silicon are coming into use. In addition, there has been increasing demand for polycrystalline silicon which has higher carrier mobility and other characteristics.

The liquid phase growing method is also suited for growing such crystalline silicon of a high quality on a large substrate such as a glass plate. Though use of a glass plate or the like makes it unallowable to heat a solution to a high temperature, it is possible to grow a crystal of a good quality by using indium as a solvent. Though it is impossible to grow a thick crystal at a low growth temperature which lowers a solubility of silicon into indium, there is no problem in formation of a crystal to be used as a TFT having a thickness of the order of 0.1 to 0.5 $\mu$m which is far smaller than that of a solar cell. When indium is used as a solvent for production of a TFT, a problem related to reproducibility may be posed. Therefore, a concentration of a dopant must be precisely controlled in order to enhance reproducibility of characteristics of the TFT. In formation of a film having a large area, an ununiform distribution of a dopant concentration is not preferable as it produces an ununiform distribution of characteristics of TFT, thereby producing variations in image density on a display device. In certain cases where indium was used as a dopant, it was impossible to sufficiently prevent the dopant from being distributed ununiformly on surfaces.

SUMMARY OF THE INVENTION

The present invention has been achieved in view of the current circumstances described above, and an object of the present invention is to provide a method of precisely controlling a dopant to be incorporated into crystalline silicon which is grown in a liquid phase using indium as a solvent, thereby enabling mass production of solar cells having a high efficiency and a light weight as well as driving circuits for a high precision and high speed display having a large area.

The present invention therefore provides a method of growing a silicon crystal, which comprises using a melt prepared by dissolving a solid of silicon containing a dopant at a predetermined concentration into liquid indium. Furthermore, the present invention provides a method of growing a silicon crystal, which comprises using a melt prepared by dissolving a solid of indium containing a dopant at a predetermined concentration into liquid indium.

Moreover, the present invention provides a method of producing a solar cell, which comprises the steps: preparing a melt by dissolving a solid of silicon containing a dopant at a predetermined concentration into liquid indium; forming a first silicon layer of a first conductivity type on a substrate by bringing the substrate into contact with the melt; and forming a second silicon layer of a second conductivity type on the first silicon layer of the first conductivity type.

In addition, the present invention provides a method of producing a solar cell, which comprises the steps of: preparing a melt by dissolving a solid of indium containing a dopant at a predetermined concentration into liquid indium and further dissolving silicon into the melt; forming a first silicon layer of a first conductivity type on a substrate by bringing the substrate into contact with the melt; and forming a second silicon layer of a second conductivity type on the first silicon layer of the first conductivity type.

DESCRIPTION OF THE PREFERRED EMBODIMENTS

The present invention has been achieved on the basis of knowledge obtained by experiments which are described below.

First, commercially available indium pellets were put into a carbon crucible, heated and melted at 1000° C. in a hydrogen gas flow to obtain liquid indium. A melt was prepared by bringing non-doped polycrystalline silicon into contact with the liquid indium and dissolving silicon into the liquid indium until it was saturated. Then, the melt was gradually cooled until it was supersaturated. When the melt was cooled to 980° C., a substrate of non-doped polycrystalline silicon was brought into contact with the melt, whereby a silicon crystal having a thickness of 10 $\mu$m was epitaxially grown on the substrate. A measurement of specific resistance of the silicon crystal by the four-probe method indicated approximately 0.2 $\Omega$cm. Specific resistance was varied within a range from 0.1 to 0.5 $\Omega$cm in similar experiments which were carried out using three different lots of commercially available indium as the melt.

A similar experiment was carried out using indium pellets refined to a high purity (6N), whereby a grown silicon layer on the substrate has an extremely high resistance (a difference in resistance between the grown silicon and the substrate could not be evaluated). By secondary ion mass spectrometry (SIMS) analysis of impurities contained in the grown silicon layer, no indium itself was unanticipatedly detected in any sample (below measurable limit). However, it was found that various kinds of impure elements such as gallium and aluminum of Group III in particular other than indium were contained in samples which were grown using commercially available indium. From this result, it is presumed that indium itself can hardly be incorporated into a siliconcrystal grown in a liquid phase, but the elements of Group III other than indium which were contained in the commercially available indium pellets were easily incorporated into the silicon crystals, thereby lowering resistance. In other words, it is necessary for precise control of conductivity of silicon to precisely control impurities, in particular, elements of Group III which are contained in indium.

Then, silicon was grown using a melt which was prepared by dissolving silicon into highly pure indium until it was saturated and then dissolving pellets of boron and aluminum. However, specific resistance of silicon grown as described above was low in reproducibility. The result of SIMS analysis indicated variations in concentrations of boron and aluminum in the silicon. Furthermore, silicon was grown using a melt which was prepared by dissolving silicon into highly pure indium until it was saturated, and then dissolving powders of phosphorus and arsenic. The silicon grown as described above was certainly of the n-type but its specific resistance was low in reproducibility. The result of SIMS analysis indicated variations in concentrations of phosphorus and arsenic in the silicon.

The inventors postulated a cause for these variations as described below. Since boron (density=2.23), aluminum (density=2.70), phosphorus (density=2.69) and arsenic (density=3.9) which are used as the dopants are significantly lighter than indium (density=7.28), a solution of such a dopant tends to be concentrated on a surface of an indium melt, whereby the indium solution as a whole is hardly uniform. Furthermore, solubilities of impurities which are subsequently dissolved into indium are very likely to be influenced by a concentration of silicon which has already been dissolved in the indium. In particular, when indium is nearly saturated with silicon, a slight variation in the saturation remarkably produces influences on the solubilities of the impurities, whereby the elements which are put into the melt as impurities are not always dissolved and concentrations of the elements of the impurities may be unstable in the melt.

It is possible to dissolve the elements of the impurities before dissolving silicon into indium by reversing the dissolving order. In this case, since pellets or powders of the impurities are to be put in trace amounts as compared with that of silicon, it is difficult to uniformly distribute the elements of the impurities in the melt as a whole.

For the reason described above, it is believed that indium makes it difficult to obtain a high degree of reproducibility of doping, though indium itself exhibits excellent properties as a melt in that it is hardly incorporated into silicon crystals and it facilitates obtaining high quality silicon crystals. The inventors therefore considered the possibility of diluting and then dissolving impurities into liquid indium. However, a diluent to be used for this purpose must be a substance which is hardly incorporated into grown silicon crystals or produces no adverse influence even when it is incorporated into the silicon crystals.

Indium can be used as a first example of an adequate diluent. An alloy prepared by dissolving impurities into indium at a predetermined concentration makes it possible to more accurately control concentrations of the impurities and prevent adverse influences from being produced by a diluent incorporated into silicon. Further, such an alloy is advantageous also from a viewpoint of having a slightly different density from that of a solvent, that is, liquid indium. When the diluted impurities are dissolved before dissolving silicon, it is possible to prevent the influence due to a concentration of silicon and use pellets or powders in large amounts, thereby uniformly dissolving the elements of the impurities into the melt.

Silicon can be used as a second example of an adequate diluent. When the elements of the impurities are preliminarily diluted with silicon, the elements of the impurities are always and simultaneously dissolved into indium with silicon, thereby facilitating the maintenance of constant concentrations of the elements relative to that of silicon.

The present invention which is based on the idea described above will be described in detail below with reference to effects and preferred embodiments thereof. However, the present invention is not limited to the following examples.

EXAMPLE 1

Figure 1:
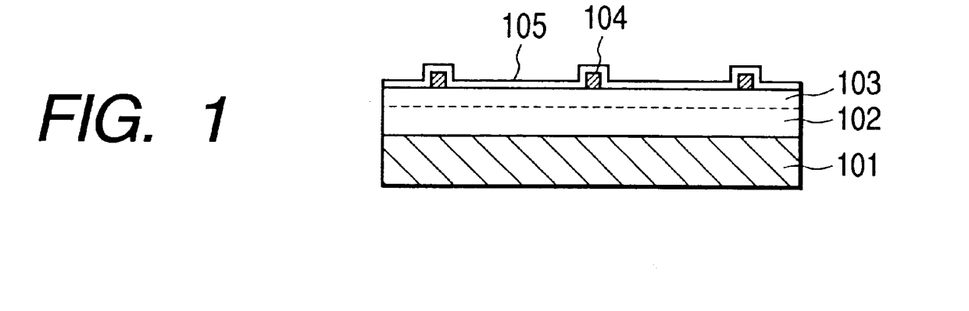
FIG. 1 is a sectional view showing one example of a solar cell according to the present invention.

In Example 1, a solar cell having a structure shown in FIG. 1 was produced using a metal grade silicon substrate which had a low purity and was inexpensive due to the low purity.

What is meant by "metal grade silicon" is silicon which has a purity on the order of 99% and is obtained by metallurgically reducing silica. A substrate 101 of a metal grade polycrystalline silicon which was 0.1 mm thick and 4 inches in diameter was produced by dissolving a metal grade silicon nugget and gradually cooling it in a carbon die coated with silicon nitride. The substrate 101 contained boron at a high concentration and was of a strong p-type. Using a liquid phase growing apparatus which had a configuration shown in FIG. 3, a layer 102 of a p-type polycrystalline silicon was grown on the substrate 101.

Figure 3:
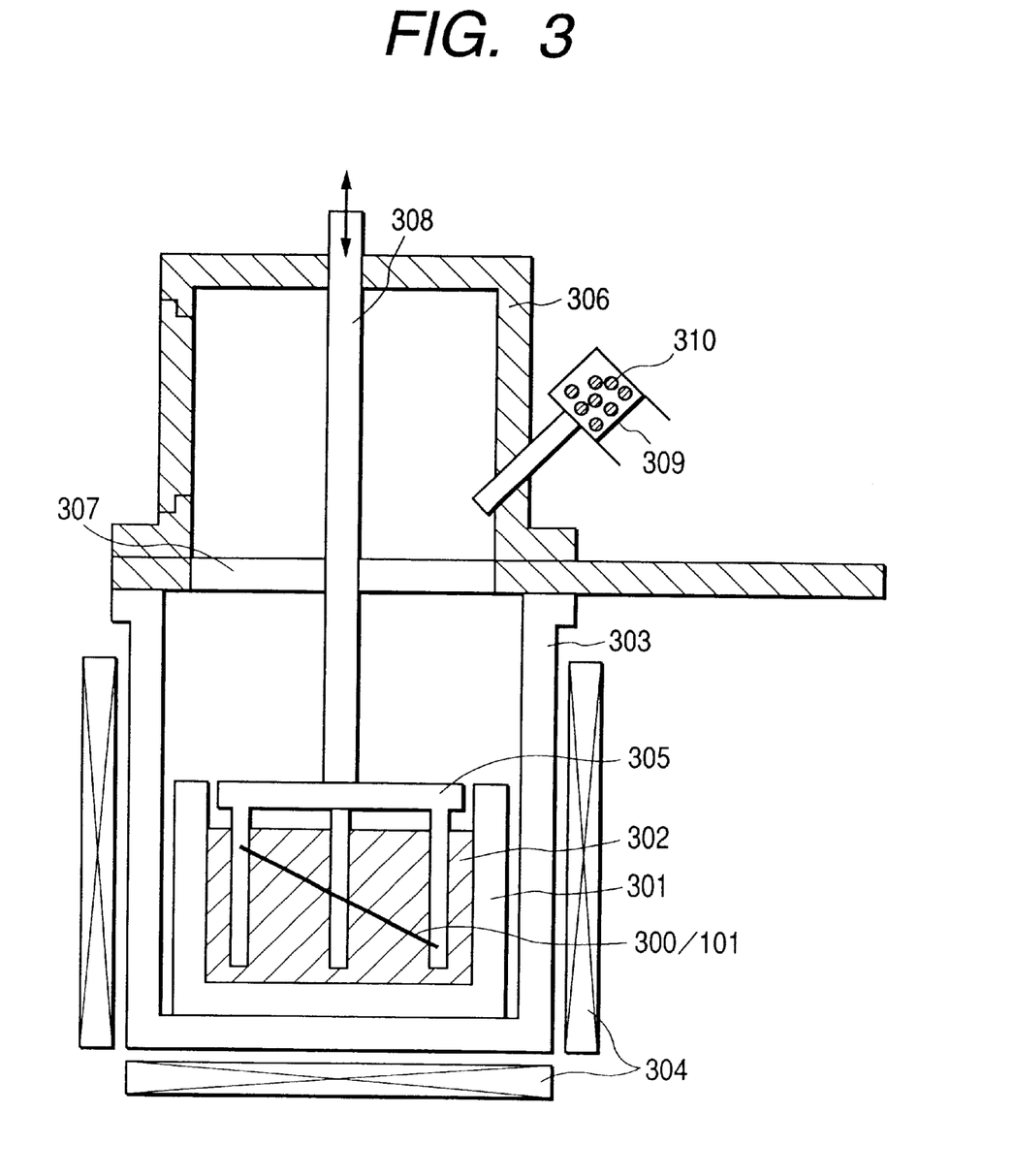
FIG. 3 is a sectional view showing one example of an apparatus used for carrying out a method of producing a silicon crystal according to the present invention.

In the apparatus shown in FIG. 3, a crucible 301 made of quartz glass is filled with a dissolved indium melt 302. The apparatus is accommodated as a whole in a quartz bell-jar 303 and heated to a desired temperature from outside with electric furnaces 304. Hydrogen gas is always introduced into the quartz bell-jar 303 to maintain a reducing atmosphere in the bell-jar 303. Further, a reference numeral 305 represents a substrate susceptor made of quartz glass which holds ends of a substrate 300 of a highly pure polycrystalline silicon or the substrate 101 of the metal grade polycrystalline silicon 101 having a diameter of 4 inches. The substrate 100 or 300 of the polycrystalline silicon is held obliquely so as to move smoothly into and out of the melt 302. A reference numeral 306 designates a load lock chamber which can be partitioned from the quartz bell-jar 303 with a gate valve 307. When setting silicon in the susceptor 305 or replacing silicon with another, the susceptor 305 is hoisted up with a hoist mechanism 308, and the gate valve 307 is closed to prevent an interior of the quartz bell-jar 303 from being exposed to the atmosphere. A reference numeral 309 represents a dopant introducer which is configured also as a load lock mechanism and allows pellets 310 containing a dopant to be put into the indium melt 302 in a condition where the gate valve 307 is opened and the susceptor 305 is hoisted up.

Now, the method of growing the layer 102 of the p-type polycrystalline silicon will be described. First, the indium melt 302 was heated to 1000° C. and pellets 310 of highly pure indium containing 1% by weight of aluminum were put into the indium melt 302. Since the indium pellets had a density which was nearly the same as that of indium, it was believed that the indium pellets were to uniformly disperse in the melt. Then, the substrate 300 of highly pure polycrystalline silicon was submerged as shown in FIG. 3. The substrate 300 was maintained in this condition for 30 minutes to dissolve silicon into the indium melt 302 until it was saturated.

Then, the gate valve 307 was closed, the substrate 300 of the highly pure polycrystalline silicon was removed from the susceptor 305, and a substrate 101 of metal grade polycrystalline silicon having the diameter of 4 inches was placed in the susceptor. After replacing an internal gas of the load lock chamber 306 first with nitrogen and then with hydrogen, the gate valve 307 was opened and the susceptor 305 was hoisted down to a preheating position (not shown in the drawings) over the melt 302 to wait for the temperature of the substrate 101 to rise. Thereafter, cooling of the interior of the quartz bell-jar was started at a rate of 1° C./minute. When the temperature reached 990° C., the substrate 101 was submerged into the melt 302. Thirty minutes later, the susceptor 305 was hoisted up and the load lock chamber 306 was closed with the gate valve 307. After replacing an internal gas of the load lock chamber 306 with nitrogen, the substrate 101 was taken outside. A p-type polycrystalline silicon layer 102 having a thickness of 30 µm had been grown on the substrate 101.

A PSG layer (phosphor silicate glass layer) having a thickness of 200 Å was deposited on the surface of the p-type polycrystalline silicon layer 102 at a temperature of 560° C. using a CVD apparatus (not shown in the drawings). An $n^+$-type silicon layer 103 was formed on the surface side by annealing the PSG layer in a nitrogen gas flow at a temperature of 1050° C. for 30 minutes and diffusing phosphorus (P). The remaining PSG was eliminated by etching with an aqueous solution of hydrofluoric acid. Furthermore, aluminum was deposited to a thickness of 2 µm on the surface of the $n^+$-type silicon layer 103 by sputtering, and comb-teeth like grid electrodes 104 were formed by photolithography. Successively, a titanium oxide film having a thickness of 600 Å was deposited by sputtering as an anti-reflection film 105. At this stage, pads of the grid electrodes 104 were masked to prevent titanium oxide from being deposited thereon. A solar cell produced as described above will hereinafter be referred to as a solar cell 1.

The characteristic of the solar cell 1 was evaluated with an AM-1.5 solar simulator to obtain a photoelectric conversion efficiency of 13%. Furthermore, 21 subcells each having an area of 1 $cm^2$ were formed on the substrate 101 and checked for distribution of the photoelectric conversion efficiency. The result indicated a distribution within ±2% which was a favorable result. Moreover, a silicon crystal was grown successively five times while replenishing aluminum and silicon in the same procedures as those for the first growth in the amount of aluminum and silicon lost in each growth due to the deposition from the melt. This experiment indicated the variation of the photoelectric conversion efficiency within ±3% at one and the same location of each substrate, which was a favorable result.

As a comparative example, a solar cell 2 was produced in the same procedures as those for the solar cell 1, except that pellets of pure aluminum were used as the pellets 310 containing the dopant. In this case, aluminum could hardly be incorporated into a p-type polycrystalline silicon layer 102 even when a dopant was replenished in a theoretically adequate amount. When the dopant was replenished in an amount exceeding the adequate amount, however, irregular spots were generated on the surface of the substrate 101 and the p-type polycrystalline silicon layer 102, which were considered to be formed by reaction between silicon and aluminum. It is presumed that a layer of melted aluminum was formed on a surface of the melt and reacted with the substrate 101 or the silicon layer 102. The solar cell 2 had remarkably ununiform photoelectric conversion efficiencies, and certain subcells exhibited no photoelectric conversion efficiencies at all. Thus, the effects of the present invention was clarified by this comparison.

EXAMPLE 2

Figure 2A:
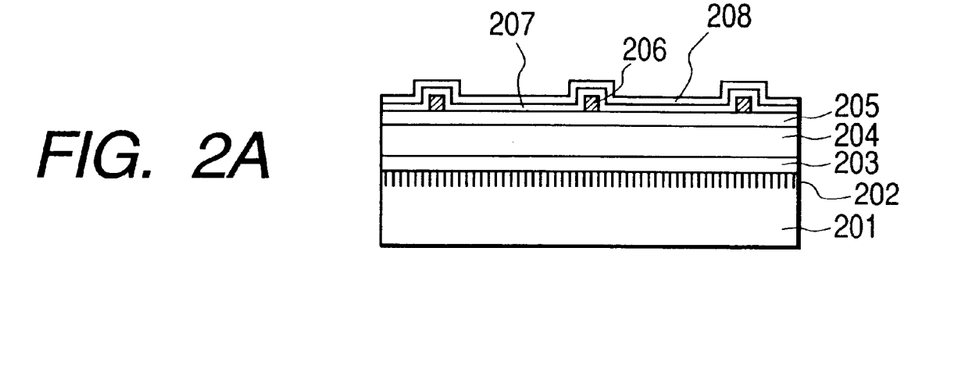
FIGS. 2A, 2B and 2C are sectional views showing one example of the production steps of a solar cell according to the present invention.
Figure 2B:
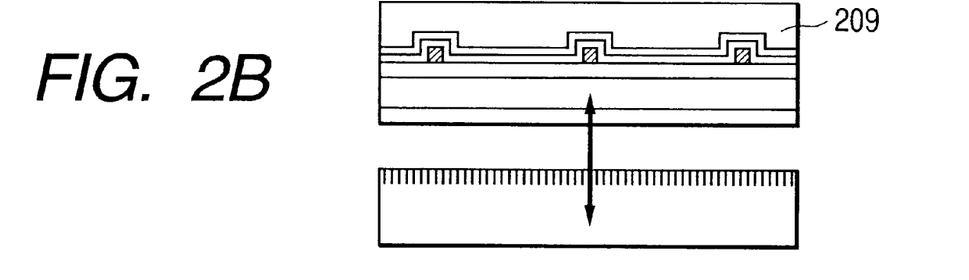
Figure 2C:
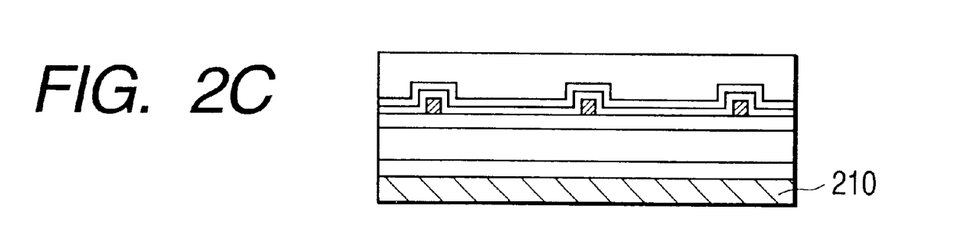

Example 2 shows a principle of a method of producing a light-weight and highly efficient solar cell at a low cost by repeatedly using an expensive silicon wafer in steps shown in FIGS. 2A to 2C. First, a porous layer 202 which was 5 µm thick was formed on a surface of a $p^+$-type (100) single crystalline silicon wafer 201 having a diameter of 2 inches by so-called anodization which applies a positive voltage in hydrofluoric acid. The porous layer is composed of a large number of micropores which have a diameter of 100 Å which are formed by ununiformly dissolving silicon due to electrochemical action of hydrofluoric acid and which extend in a direction of a film thickness while complicatedly tangling with one another. It is possible to epitaxially grow a single crystalline silicon on this layer since a portion remaining as a skeleton maintains a property of a single crystal. Methods of forming a porous layer and application of the porous layer to solar cells are detailed by Japanese Patent Application Laid-Open Nos. 5-283722 and 7-302889.

Figure 4:
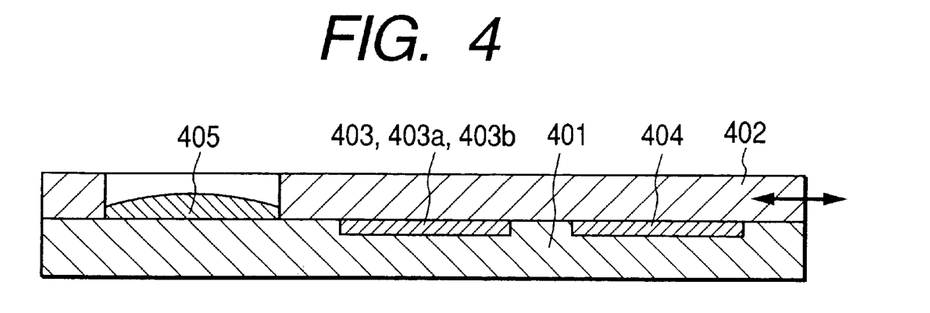
FIG. 4 is a sectional view showing one example of an apparatus used for carrying out the method of producing a silicon crystal according to the present invention.

FIG. 4 shows an apparatus for growing single crystalline silicon which was used in Example 2. Reference numerals 401 and 402 represent members which compose a carbon boat. The member 401 is provided with a cavity for dropping substrates 403, 403a and 403b for dissolving and a cavity for dropping a substrate 404 for growing. The member 402 is provided with a hole in which an indium melt 405 is to be accommodated. The members 401 and 402 are configured to slide relative to each other.

A polycrystalline silicon substrate 403 for dissolving silicon into a melt and a single crystalline silicon substrate 404 having a porous layer 202 formed on the surface for growing a crystal were arranged in the member 401. The member 402 was laid on the member 401, and a predetermined amount of highly pure indium pellets were placed in the hole of the member 402. When the indium pellets were heated in a hydrogen flow, they were melted into a melt 405 as shown in FIG. 4. After maintaining the growing apparatus at 1050° C. for five minutes, the temperature was adjusted to 1000° C. and the melt 405 was brought into contact with the substrate 403 for dissolving by sliding the member 402. As the substrate 403 for dissolving, a p-type polycrystalline silicon substrate doped with boron having specific resistance of 0.01 Ωcm was used. After keeping this state for one hour, cooling of the apparatus as a whole was started at a rate of 1° C./minute. When the temperature reached 980° C., the member 402 was slid to bring the melt 405 into contact with a surface of the porous layer 202 and cooled for one minute to form a $p^+$-type silicon layer 203 having a thickness of approximately 1 µm. Thereafter, the melt was returned to its initial position by sliding the member 402 once again and left standing for cooling.

When the apparatus was cooled to room temperature, the hardened melt and the substrate 403 for dissolving were removed, whereafter highly pure indium pellets and the substrate 403a for dissolving made of the p-type polycrystalline silicon doped with boron and having specific resistance of 1 Ωcm were newly arranged and heated in a manner similar to that at the preceding stage. After bringing the melt 405 into contact with the substrate 403a for dissolving at a temperature of 1000° C., keeping it in this condition for one hour, cooling of the apparatus as a whole was started at a rate of 1° C./minute. When temperature was lowered to 980° C., the melt 405 was brought into contact with the surface of the p+-type silicon layer 203 by sliding the member 402 once again and cooled for thirty minutes, thereby forming a p-type silicon layer 204 which was approximately 30 μm thick. Then, the melt was returned to its initial position by sliding the member 402 once again and left standing for cooling.

When the melt was cooled to room temperature, the hardened melt and the substrate 403a for dissolving were removed, whereafter highly pure indium pellets, and a substrate 403a for dissolving made of n-type polycrystalline silicon doped with phosphorus and having specific resistance of 0.01 Ωcm were newly disposed and heated in a manner similar to that at the preceding stage. After bringing the melt 405 into contact with the substrate 403b for dissolving at a temperature of 1000° C. and keeping it in this condition for one hour, cooling of the apparatus as a whole was started at a rate of 1° C./minute. When temperature was lowered to 980° C., the melt 405 was brought into contact with the surface of the p-type silicon layer 204 by sliding the member 402 and cooled for thirty seconds, thereby forming an n+-type silicon layer 205 which was approximately 0.5 μm thick. Thereafter, the melt was returned to its initial position by sliding the member 402 once again and left standing for cooling.

Furthermore, aluminum was deposited to form a 2 μm thick layer on the n+-type silicon layer 205 by sputtering while masking the layer 205, thereby forming grid electrodes 206. A titanium dioxide film 207 having a thickness of 600 Å and a magnesium fluoride film 208 having a thickness of 1000 Å were stacked as anti-reflection layers 207 and 208 by sputtering. In sputtering of the anti-reflection layers, grid tabs were masked so that the anti-reflection layers were not deposited thereon.

A transparent adhesive tape 209 was bonded to a surface of the anti-reflection layer thus formed. After a stacked body from the p+-type silicon layer 203 to the anti-reflection layer 208 was peeled from the silicon wafer 201 by destroying the porous layer 202 by applying forces in directions indicated by arrows in FIG. 2B, an aluminum sheet 210 was bonded to a back surface of the p+-type silicon layer 203 with an electroconductive adhesive, thereby forming a solar cell 3.

The characteristic of the solar cell 3 was evaluated with an AM-1.5 solar simulator to obtain a photoelectric conversion efficiency of 18%. Furthermore, 26 subcells each having an area of 0.25 cm² were formed on a substrate 210 of an aluminum sheet and checked for a distribution of photoelectric conversion efficiencies. This result indicated a distribution within ±3%, which was a favorable result.

As a comparative example, a solar cell 4 was produced in the same procedures as in the case of the solar cell 3, except that a melt was prepared by arranging powders of boron and phosphorus as dopants in the hole of the member 402 together with indium pellets and that a non-doped polycrystalline silicon was used as the silicon for dissolving. Possibly due to a fact that boron and phosphorus were not uniformly distributed in the melt in the liquid phase growth, photoelectric conversion efficiencies of the subcells were 10% at most and distributed within a broad range, and certain subcells exhibit no photoelectric conversion efficiency at all.

EXAMPLE 3

Example 3 shows steps for mass production of solar cells having a structure which is basically the same as that of the solar cell produced in Example 2 and proves that the method of the present invention is preferably applicable to mass production.

A porous layer 202 having a thickness of 2 μm was formed on each 6-inch silicon wafer 201. In this case, the porous layers 202 could be formed on each of the wafers at the same time, and a working efficiency could be remarkably enhanced by connecting ten silicon wafers 210 in series in a solution of hydrofluoric acid and supplying a current to the wafers.

Figure 5:
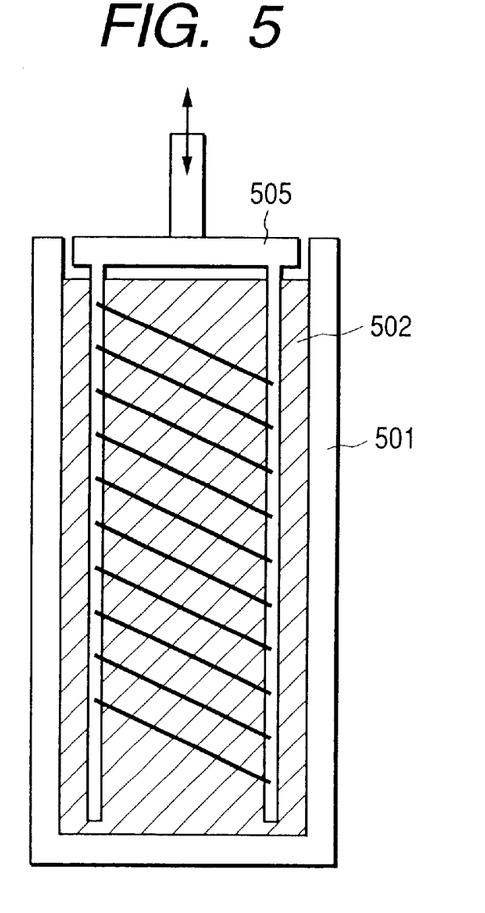
FIG. 5 is a sectional view showing one example of an apparatus used for carrying out the method of producing a silicon crystal according to the present invention.

An apparatus for growing silicon crystal according to the present invention was based on the same principle as that of the apparatus adopted for Example 1 shown in FIG. 3, provided that a substrate susceptor 505 was used which is made of quartz glass and configured to be capable of accommodating ten substrates. Quartz glass crucibles 501 and quartz bell-jars (not shown in the drawings) are deepened correspondingly. The apparatus can be configured so as to accommodate a larger number of substrates to enhance production efficiency. Three quartz bell-jars having similar internal structures are connected to a common load lock chamber by way of gate valves so that substrates can move from one bell-jar into another without being exposed to the atmosphere.

First, a melt was prepared by placing highly pure indium pellets in a crucible 501 of a first quartz bell-jar, heating and melting the pellets at 1000° C. Highly pure indium pellets containing 1% by weight of aluminum were put into the melt, and then a polycrystalline silicon substrate for dissolving was submerged into the melt and kept in this condition for 30 minutes to dissolve silicon into the indium melt until it was saturated, thereby preparing a melt for growing a p+-type silicon layer.

Then, a melt was prepared by placing highly pure indium pellets in a crucible of a second quartz bell-jar, heating and melting the pellets at 1000° C. Then, ten substrates of polycrystalline silicon doped with boron and having a specific resistance of 0.05 Ωcm were attached to a susceptor 505, submerged into the indium melt, kept in this condition for 30 minutes to dissolve silicon until the indium melt was saturated, thereby preparing a melt for growing a p-type silicon layer.

Further, a melt was prepared by placing highly pure indium pellets in a crucible of a third quartz ball-jar, heating and melting the pellets at 1000° C. Highly pure indium pellets containing 1% by weight of arsenic were put into the melt, and a polycrystalline silicon substrate for dissolving was submerged into the melt and kept in this condition for 30 minutes to dissolve silicon into the indium melt until it was saturated, thereby preparing a melt for growing an n+-type silicon layer.

With the gate valves kept closed, the polycrystalline silicon substrate for dissolving was removed from the susceptor 505 and a silicon wafer 201 (hereinafter simply referred to "substrate") having a diameter of six inches and a porous layer 202 formed on a surface thereof was set in the susceptor. After replacing an internal gas of the load lock chamber first with nitrogen and then with hydrogen, the gate valve of the first quartz bell-jar was opened, the susceptor 505 was hoisted down to its preheating position, an interior of the quartz bell-jar was maintained at 1050° C. for ten minutes and then cooled to 1000° C., and gradual cooling of the interior of the quartz bell-jar was started at a rate of 0.2° C./minute. When the temperature reached 995° C., the substrate was submerged into the melt 502 as shown in FIG. 5. After keeping this condition for ten minutes, the susceptor 505 was hoisted up. A p⁺-type silicon layer 203 having a thickness of approximately 2 μm was grown on the porous layer 202. Since this apparatus treated a large number of substrates and required time for pulling the susceptor into and out of the melt, a crystalline silicon growing rate was set at a low level in order not to vary the thickness of the p⁺-type silicon layer 203 of each substrate.

After completely hoisting up the susceptor, the first quartz bell-jar was closed to maintain a hydrogen atmosphere in the load lock chamber, the gate valve of the second bell-jar was opened, the susceptor 505 was hoisted down to its preheating position and an interior of the bell-jar was maintained at 1000° C. for ten minutes. Then, gradual cooling of the interior of the quartz bell-jar was started at a rate of 1° C./minute. When the temperature reached 980° C., the substrate was submerged into the melt 502 as shown in FIG. 5. After keeping this condition for 30 minutes, the susceptor 505 was hoisted up and the load lock chamber was closed. A p-type silicon layer 204 having a thickness of approximately 30 μm was grown on the p⁺-type silicon layer 203.

While keeping the hydrogen atmosphere in the load lock chamber, the gate valve of the third quartz bell-jar was opened, the susceptor 505 was hoisted down to its preheating position, an interior of the quartz bell-jar was maintained at 1000° C. for ten minutes and then gradual cooling was started at a rate of 0.2° C./minute. When the temperature reached 995° C., the substrate was submerged into the melt 502. After maintaining this condition for two minutes, the susceptor 505 was hoisted up and the load lock chamber was closed. An n⁺-type silicon layer 205 having a thickness of approximately 0.4 μm was grown on the p-type silicon layer 204.

Thereafter, comb-like grid electrodes 206 were formed on the surface of the n⁺-type silicon layer 205 by printing a copper paste by the screen printing method and calcining the paste. Successively, a titanium dioxide film 207 having a thickness of 600 Å was formed by coating a metal alkoxide solution by the sol-gel method and calcining the solution, and a film (208) of silicon oxide 800 Å thick was formed in procedures similar to those used to obtain the two anti-reflection layers 207 and 208. Ten or more substrates can easily be treated at a time by the screen printing method and the sol-gel method which are capable of treating a large number of substrates. These methods are preferable. Successively, an adhesive tape 209 was bonded to a surface of the anti-reflection layer, the layers of the p⁺-type silicon layer 203 from the upper layers were peeled from the substrate 201 by applying a force to the substrate 201 so as to destroy the porous layer 202, and the tape 209 was peeled off with an organic solvent. Thereafter, a back surface of the p⁺-type silicon layer 203 was coated with an electroconductive ink, bonded to an aluminum support plate 210 and calcined for setting, thereby producing solar cells 5.

Ten solar cells 5 were evaluated with an AM-1.5 solar simulator to obtain photoelectric conversion efficiencies of 17±0.3%, which were favorable and uniform. Furthermore, a solar cell module 1 was produced by connecting the ten solar cells in series and bonding them to a heat-resistant glass plate having a thickness of 3 mm with a PVC resin. This solar cell module 1 had an output of approximately 30 W.

Successively to the module 1, a module 2 was produced in similar procedures. During the producing, the melts were not cooled but kept in melted conditions. However, the polycrystalline silicon substrate for dissolving was submerged again into the melt in each of the quartz bell-jars to dissolve silicon until the melt was saturated, since silicon concentration was lowered by deposition of a silicon crystal on the substrate. Boron was supplied together with silicon into the melt in the second quartz bell-jar. Since dopant concentrations were lowered in the melts in the first and third quartz bell-jars, pellets containing a predetermined amount of aluminum or arsenic were replenished into the melts in the first and third quartz bell-jars before replenishing silicon. The method of the present invention is capable of uniformly supplying a dopant with a high repeatability even when using a large crucible for mass production, whereby the module 2 also exhibited a characteristic equal to that of the module 1.

As a comparative example, ten solar cells were produced at a batch by replenishing the melts with pellets or powders each containing a single element of aluminum, boron or phosphorus. These solar cells exhibited remarkably variable characteristics, and therefore a solar cell module 3 composed of these solar cells in series had an output characteristic of 5 W, illustrating that the method of the present invention is extremely excellent in mass production of modules connecting in series.

EXAMPLE 4

Example 4 shows an example that the method of the present invention was applied to the production of a thin film transistor (TFT) of polycrystalline silicon formed on a glass plate which was to be used in a driving circuit for a liquid crystal display device. FIGS. 6A to 6F schematically show production steps. Stacked films of aluminum/chromium having a thickness of 2000 Å were deposited on a glass substrate 601 having a size of 4-inch square by sputtering. A pattern was formed as a gate electrode 602 on these films by photolithography (see FIG. 6A). Using disilane and ammonia as raw material gases, a silicon nitride film having a thickness of 3000 Å was deposited as a gate insulating film 603 on the gate electrode 602 by the CVD method (see FIG. 6B).

Used in Example 4 was a growing apparatus having a structure which was similar to that of the apparatus shown in FIG. 3 except that two quartz bell-jars were connected to a common load lock chamber by way of gate valves. First, an n-type polycrystalline silicon substrate doped with arsenic having a specific resistance of 0.5 Ωcm and a size of 4-inch square was submerged into an indium melt 302 in a crucible of a first quartz bell-jar as shown in FIG. 3 and maintained in this condition for thirty minutes to dissolve silicon into the melt 302 until it was saturated, thereby preparing a melt for an n-type silicon layer for dissolving. After indium pellets containing 2% by weight of boron were dropped in a predetermined amount into a highly pure indium melt in a second quartz bell-jar, a highly pure polycrystalline silicon substrate having a size of 4-inch square was dissolved thereto, thereby preparing a melt for a p⁺-type silicon layer for dissolving.

Then, the gate valve was closed, the polycrystalline silicon substrate was dismounted from a susceptor, and the glass substrate 601 on which the gate insulating film 603 had been formed was set in the susceptor. After an internal gas of the load lock chamber was replaced with nitrogen and then with hydrogen, the gate valve of the first quartz bell-jar was opened, and the susceptor was hoisted down to its preheating position and held at 600° C. for ten minutes to wait for the temperature of the substrate 601 to rise. Thereafter, gradual cooling of an interior of the quartz bell-jar was started at a rate of 0.2° C./minute. When the temperature reached 595° C., the substrate 601 was submerged into the melt. The substrate was maintained in this condition for 30 minutes until an n-type polycrystalline silicon layer 604 having a thickness of 3000 Å was grown on the gate insulating film 603. Then, the susceptor was hoisted up, the gate valve was closed, the gate valve of the second quartz bell-jar was opened while maintaining the hydrogen atmosphere, and the susceptor was hoisted down to its preheating position and kept at 600° C. for ten minutes, whereafter gradual cooling of an interior of the quartz bell-jar was started at a rate of 0.2° C./minute. When the temperature reached 595° C., the substrate 601 was submerged in the melt and maintained in this condition for five minutes, whereby a $p^+$-type silicon layer 605 having a thickness of 500 Å was grown on the n-type silicon layer 604 (see FIG. 6C). Though silicon was grown at a very low rate in Example 4 due to the use of the glass substrate which did not allow the melt to be heated to a high temperature, the growth could be completed in a time within a range similar to that for the other examples since a necessary layer thickness was small.

Figure 6A:
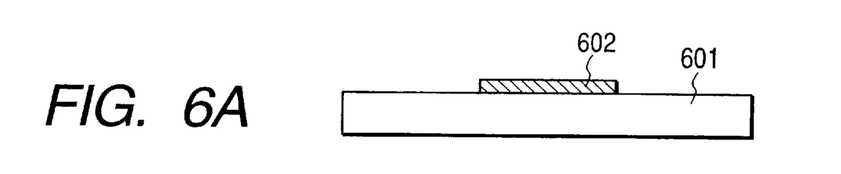
FIGS. 6A, 6B, 6C, 6D, 6E and 6F are sectional views showing one example of the production steps of a thin film transistor (TFT) of polycrystalline silicon to which the method of the present invention is applied.
Figure 6B:
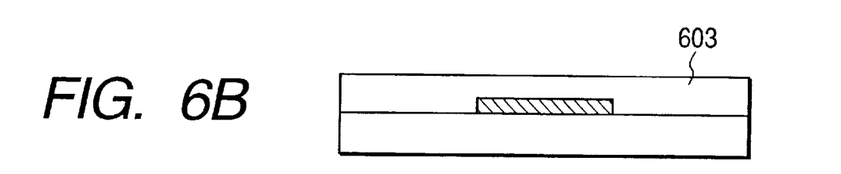
Figure 6C:
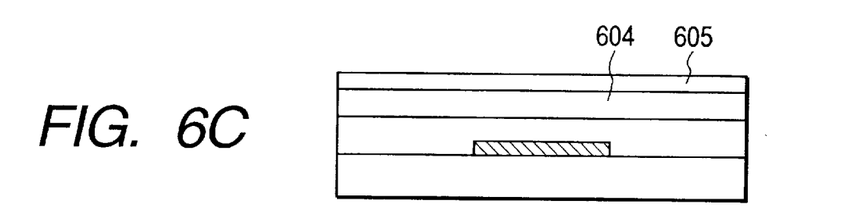
Figure 6D:
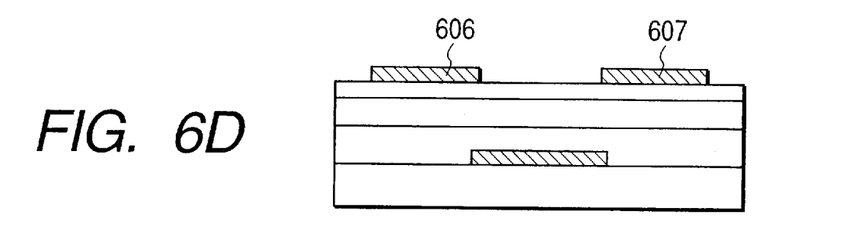
Figure 6E:
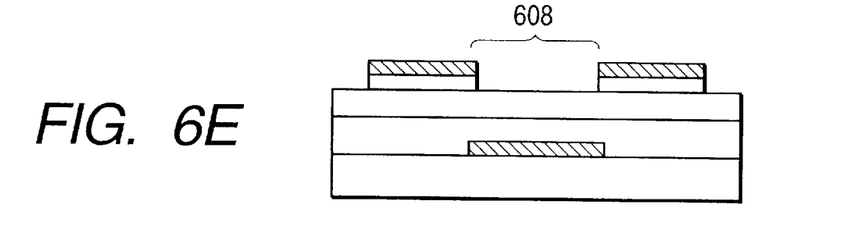
Figure 6F:
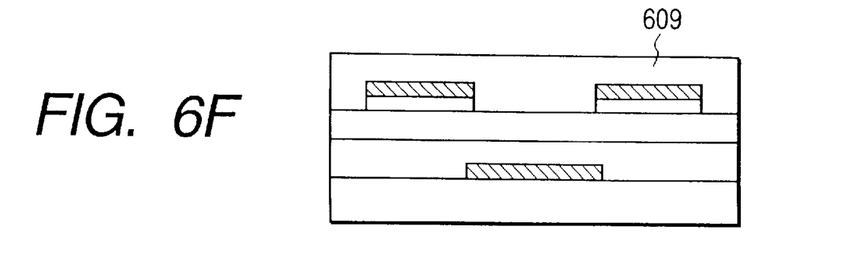

After depositing stacked films of chromium/aluminum by sputtering, a source electrode 606 and a drain electrode 607 were patterned by photolithography (see FIG. 6D). Using the electrodes 606 and 607 as masks, unnecessary portions of the $p^+$-type layer at a channel portion 608 were removed by dry etching (see FIG. 6E). Furthermore, a silicon oxide layer 609 was deposited on the surface by sputtering for surface protection (see FIG. 6F).

In order to check the TFT for its basic characteristic, −5 V and 0 V were applied to the gate electrode while applying 5 V across the source and drain electrodes. This result indicated an on/off ratio of $10^6$. Moreover, a distribution of on/off ratios of $10^4$ TFTs formed in the substrate was within an extremely narrow range of ±20%. Accordingly, it is possible to obtain display devices having a high contrast and free from ununiformity in colors by producing a driving circuit of TFTs according to the method of the present invention.

As a comparative example, a dopant was supplied as pellets or powders each singly composed of a dopant element. In this comparative example, on/off ratios of TFTs were distributed within a wide range of $10^2$, whereby the TFTs could not be expected to be usable for driving display devices.

As understood from the foregoing description, the method of the present invention is capable of growing high quality silicon crystals having a dopant concentration favorably controlled, thereby making it possible to produce high performance solar cells, driving circuits for liquid crystal display devices and so on at a low cost and with a high reproducibility.

What is claimed is:

1. A method of producing a solar cell, which comprises the steps of:

preparing a melt by melting indium to obtain liquid indium, and then dissolving a solid of silicon containing a dopant at a predetermined concentration into the liquid indium obtained by melting the indium;

forming a first silicon layer of a first conductivity type on a substrate by bringing the substrate into contact with the melt; and forming a second silicon layer of a second conductivity type on the first silicon layer of the first conductivity type.

2. A method of producing a solar cell according to claim 1, wherein the substrate is a silicon wafer which has a porous layer formed on a surface thereof by anodization.

3. A method of producing a solar cell according to claim 2, further comprising a step of separating the silicon wafer from the first silicon layer of the first conductivity type in the porous layer after forming the second silicon layer of the second conductivity type.

4. A method of producing a solar cell according to claim 3, wherein the separating step is carried out by using an adhesive tape.

5. A method of producing a solar cell, which comprises the steps of:

preparing a melt by dissolving a solid of indium containing a dopant at a predetermined concentration into liquid indium and then further dissolving silicon into the liquid indium;

forming a first silicon layer of a first conductivity type on a substrate by bringing the substrate into contact with the melt; and forming a second silicon layer of a second conductivity type on the first silicon layer of the first conductivity type.

6. A method of producing a solar cell according to claim 5, wherein the substrate is a silicon wafer which has a porous layer formed on a surface thereof by anodization.

7. A method of producing a solar cell according to claim 6, further comprising a step of separating the silicon wafer from the first silicon layer of the first conductivity type in the porous layer after forming the second silicon layer of the second conductivity type.

8. A method of producing a solar cell according to claim 7, wherein the separating step is carried out by using an adhesive tape.

* * * * *